MANUFACTURE OF SEMICONDUCTOR DEVICES

Filed May 8, 1957 2 Sheets-Sheet 1

INVENTOR.
Edward G. Roka
BY
[signature]
ATTORNEY

Aug. 1, 1961 E. G. ROKA 2,994,627

MANUFACTURE OF SEMICONDUCTOR DEVICES

Filed May 8, 1957 2 Sheets-Sheet 2

INVENTOR.

Edward G. Roka

BY E. W. Christen

ATTORNEY

United States Patent Office 2,994,627

Patented Aug. 1, 1961

2,994,627

MANUFACTURE OF SEMICONDUCTOR DEVICES

Edward G. Roka, Los Angeles, Calif., assignor to General Motors Corporation, Detroit, Mich., a corporation of Delaware Filed May 8, 1957, Ser. No. 657,925
2 Claims. (Cl. 148—1.5)

This invention relates to the manufacture of semiconductor signal translating devices and more particularly to a method for making junction type transistors.

In the junction transistor the alloyage of the impurity material with the semiconductor body must be precisely controlled in respect to penetration to obtain an exact spacing of the junctions. It has been found that superior control is realized by confining and applying a certain pressure to the impurity material during the heating cycle. In accordance with this invention, this is accomplished by utilizing a recessed receptacle and plural relatively slidable coaxial cylinders disposed in the receptacle and forming a jig for the semiconductive wafer and the impurity material body. In this arrangement, individual weight members are preferably supported on the cylinders to apply force thereto for confining and pressing the impurity material. The alloyage of emitter and collector impurity materials to the opposite sides of the wafer of the semiconductive wafer may be accomplished in a single heating cycle but considerable advantage is realized by a technique using two distinct heating cycles. In this technique one impurity material body is allowed to one face of the wafer while retained in the aforementioned jig, then subjected to the alloying temperature greater than the melting point of the impurity material and less than that of the semiconductive wafer. The time variation of temperature may be controlled in accordance with the number of known techniques and the time interval during which the alloying temperature is maintained may be less than that required to attain an equilibrium condition in the alloying action providing the time and temperature are carefully controlled to obtain the required degree of penetration. However, it is advantageous in many respects to maintain the allowing temperature for a time period exceeding that required for equilibrium conditions to be established in the alloying action. The wafer is then inverted in a similar jig and the other impurity body is retained in the manner aforesaid and subjected to the same temperature for the same time period. A more complete understanding of this invention may be had from the detailed description which follows taken with the accompanying drawings in which:

FIGURE 1 is an exploded view of one assembly jig and transistor parts.

FIGURE 1*a* is a cross sectional view of the assembled jig and transistor parts.

FIGURE 2 is an exploded view of another jig and the transistor parts.

FIGURE 2*a* is a cross sectional view of the jig and transistor parts shown in FIGURE 2.

Figure 4:
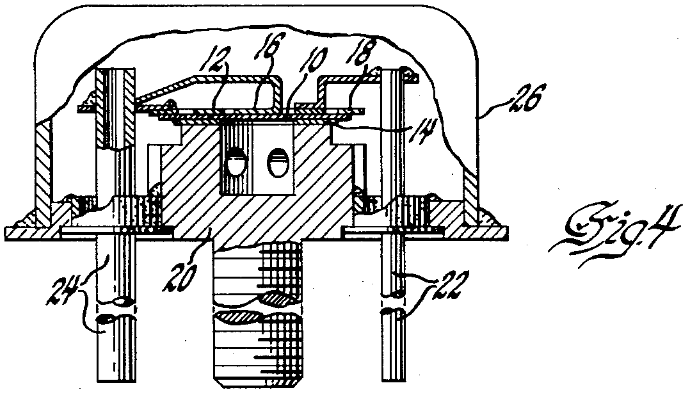
FIGURE 4 is a view partially in section of a completed transistor.

Referring now to the drawings there is shown an illustrative embodiment of the invention in apparatus for the manufacture of transistors such as the type known as PNP power transistors. It will be helpful in the outset to consider the complete transistor structure as shown in FIGURE 4. A transistor of this type is fully disclosed and claimed in the copending U.S. application Serial No. 525,010, filed by Edward G. Roka on July 28, 1955, for Semiconductor Device and assigned to the assignee of the present invention. In general, this transistor comprises a semiconductive wafer 10 of germanium of rectangular configuration and of small predetermined thickness. An emitter junction is formed in the wafer by an alloyage at one surface with a ring 12 of impurity material such as indium. A collector junction is formed by an alloyage at the other surface with an indium collector ring 14 opposite the emitter junction ring. Although both emitter and collector junctions are illustrated as being of ring configuration, the collector may suitably take the form of a dot or other shape while the ring configuration of the emitter has been found to be highly advantageous. The semiconductive wafer is provided with ohmic contacts by a center base contact element 16 and a peripheral base contact ring 18 both of which are suitably of Kovar metal. The collector ring 14 is mounted upon a metal pedestal 20 having a threaded stud depending therefrom and constituting a collector terminal. The emitter ring 12 is conductively connected to a terminal post 22 and the base contacts 16 and 18 are conductively connected to the terminal post 24. The terminal posts 20, 22, and 24 are, of course, provided for connection of the transistor into an external circuit and the transistor assembly is hermetically sealed within an inclosure 26.

In the formation of emitter and collector junctions, the penetration of the impurity material determines the spacing between the junctions and this spacing is critical to the transistor performance. The depth of penetration of the impurity material is determined by the volume of the impurity material and the selected temperature at which the alloying action is effected. In the alloying operation it is necessary to obtain uniform wetting of the semiconductive material and it is essential that a precisely controlled volume of impurity material be employed which must be confined to a predetermined area of the semiconductive material. In the confinement of the impurity material during the heating cycle, it is also necessary to prevent deposition of the impurity material upon other areas of the semiconductive material. The depth of penetration is substantially independnt of the time at which the elevated temperature is maintained provided that the time exceeds that required for the given volume and temperature to establish a condition of equilibrium in the alloying action. Thus, where plural junctions are to be formed, it is possible to effect the alloyage in a single heating cycle but a distinct heating cycle may be performed for each junction without disturbance of a previous junction so long as the temperature of each succeeding cycle does not exceed the temperature of the preceding cycles.

Figure 1:
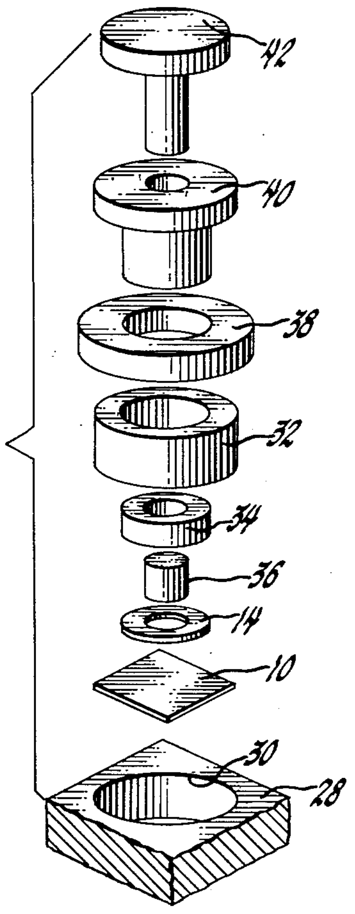

As shown in FIGURE 1, the jig for one alloying operation in the fabrication of the transistor comprises a receptacle or boat 28 defining a cylindrical recess 30 having a flat bootom wall. The boat 28 and certain other jig members in the illustrative embodiment are formed of graphite although other materials such as stainless steel or lava may be used. The recess 30 is adapted to receive the semiconductive wafer 10 which is seated against the bottom wall and circumscribed by the cylindrical wall. The impurity body or ring 14 of indium for the formation of the collector junction is disposed upon the upper surface of the germanium wafer for alloyage therewith. A plurality of coaxial graphite cylinders 32, 34, and 36 are disposed within the recess 30 over the germanium wafer 10 and indium ring 14. The outer cylinder 32 is fitted closely within the cylindrical wall of the recess 30 and is seated upon the peripheral edges of the wafer 10. The inner cylinder 36 extends through the central aperture in the indium ring 14 and is seated against the center portion of the germanium wafer 10. The intermediate cylinder 34 is slidably disposed between the inner and outer cylinders in close fitting relation therewith and is seated against the upper surface of the indium ring 14. In order to press the wafer 10 and the ring 14 with a predetermined force, a plurality of weight members 38, 40, and 42, suitably of stainless steel, are mounted upon the cylinders 32, 34, and 36, respectively. It will be appreciated that the graphite cylinders, seated against the respective parts of the transistor under the influence of the weight members, define an annular recess at the lower ends of the cylinders to accommodate the indium ring 14. The cylinders are seated independently by the respective weights to ensure confinement of the indium ring to a predetermined area of the germanium wafer and to ensure uniform contact throughout this area. The cylinders also serve to shield the remaining area of the germanium wafer against any spurious deposition of the impurity material during the alloying operation. In the event that a collector of dot configuration rather than ring configuration is desired, the inner cylinder 36, as well as the opening in the cylinder 34, may be dispensed with.

Figure 3:
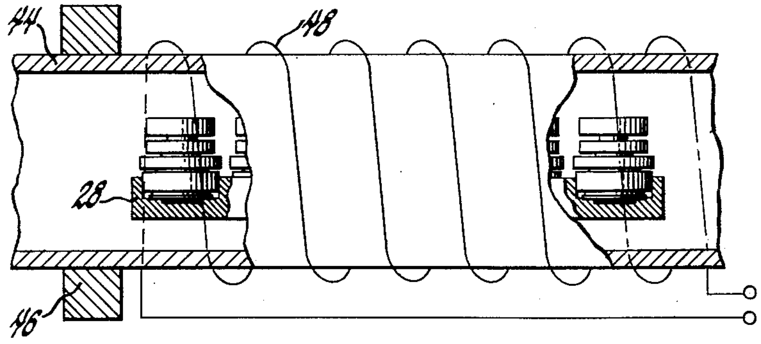
FIGURE 3 is a diagrammatic illustration of the jig disposed in a suitable heating apparatus.

The wafer 10 and the ring 14, assembled in the jig, are subjected to elevated temperatures to effect alloyage thereof. This is preferably accomplished in two cycles in heating apparatus as illustrated in FIGURE 3. It will be noted that the boat 28 may be provided with a plurality of recesses 30 each of which accommodates a jig for simultaneously alloying plural sets of semiconductive wafers and impurity bodies. The boat 28 is disposed within a quartz tube 44 which is filled with a reducing atmosphere of inert gas such as hydrogen during the heating cycle. The tube 44, mounted in a support member 46, supports a resistance heating coil 48, of Nichrome wire or the like, energized from a source not shown to produce a precisely controlled temperature in the assembly of wafer 10 and ring 14. For the manufacture of transistors in which germanium and indium are the materials involved having melting points of about 940° C. and 150° C., respectively, the alloyage is effected at an intermediate temperature, the exact value of which is determined by the amount of penetration desired and may be, for example, about 600° C. This elevated temperature may be maintained for a time period of about three minutes which is sufficient to ensure that a state of equilibrium is established in the alloying action.

Figure 2:
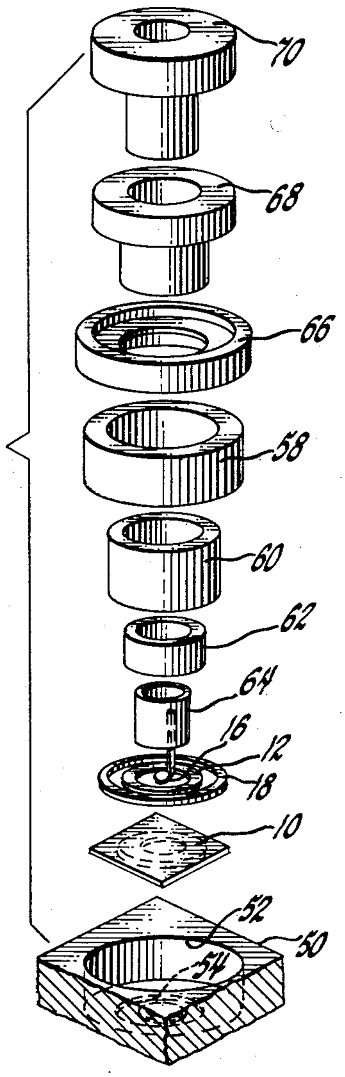
Figure 1A:
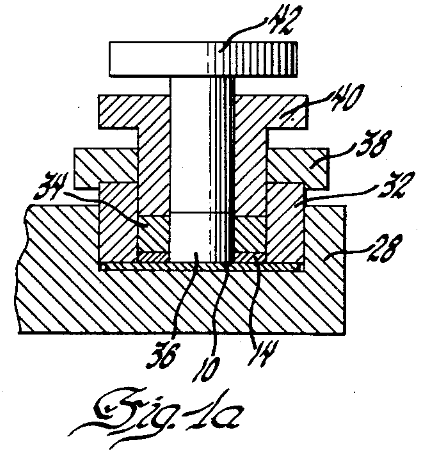
Figure 2A:
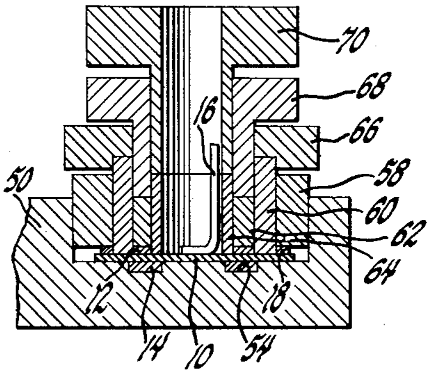

Following this first heating cycle, the alloyed wafer 10 and the ring 14 are removed and disposed in another jig for a subsequent alloying operation. As shown in FIGURE 2, there is provided a receptacle or boat 50 defining a cylindrical recess 52 terminating in a substantially flat bottom which defines an annular recess 54. The wafer 10 is inverted and disposed at the bottom of the recess 52 with the alloyed ring 14 accommodated by the annular recess 54. The emitter ring 12 and the base ring 18 are disposed coaxially on the upper surface of the wafer 10 and precisely positioned by a plurality of graphite cylinders 60, 62, and 64 in nested relation. The center contact 16 is disposed within the inner cylinder 64 having its lower end resting upon the wafer 10. The inner cylinder 64 is seated against the upper surface of the wafer 10 within the emitter ring 12. The intermediate cylinder 60 is also seated upon the wafer 10 and embraces the emitter ring 12. The intermediate cylinder 62 is slidably disposed between the cylinders 64 and 60 and seats upon the upper surface of the emitter ring 12. The outer cylinder 58 is slidably disposed between the wall of the recess 52 and the intermediate cylinder 60 seats upon the upper surface of the peripheral base ring 18. Thus, the emitter ring 12 is confined within the annular recesses defined by the lower ends of these cylinders. In order to apply a predetermined force to the cylinders 60, 62, and 64 they are fitted with individual weight members 66, 68, and 70, respectively.

The transistor assembly is subjected to a second heating cycle in the jig just described to alloy the emitter ring 12 and the wafer 10 and at the same time fuse the base contacts 16 and 18 to the wafer 10. This heating cycle is performed in the apparatus of FIGURE 3 in the same manner as that described for the first heating cycle and the temperature is increased to the same value as in the first heating cycle. By limiting the temperature of this second cycle to that of the first cycle there is no disturbance of the penetration of the previously alloyed collector ring 14 and wafer 10. The time period during which the elevated temperature is maintained is preferably the same as that of the first cycle so that a state of equilibrium is reached in the alloying action. This heating cycle is also effective to develop an ohmic contact between the base contacts 16 and 18 and the wafer 10.

The alloying operation is thus completed and the transistor thus formed may be subjected to any desired subsequent operations and encapsulated as shown in FIGURE 4. Such subsequent operations do not constitute part of the present invention and, accordingly, are not described herein.

Although the description of this invention has been given with respect to a particular embodiment, it is not to be construed in a limiting sense. Many variations and modifications within the spirit and scope of the invention will now occur to those skilled in the art. For a definition of the invention reference is made to the appended claims.

I claim:

1. The method of making a semiconductor signal translating device comprising the steps of disposing a semiconductive body upon a support structure with a horizontal surface of the body exposed, disposing a first three dimensional impurity body having an upper and lower surface and inner and outer side walls on said horizontal surface of the semiconductive body, confining the first three dimensional impurity body on all its exposed side walls, applying pressure to the first impurity body by applying the gravitational force of a predetermined weight to the upper surface of the first impurity body to hold it firmly against the semiconductive body but not force it into the surface thereof, heating the assembly of the bodies to a temperature greater than the melting point of the first impurity body and less than the melting point of the semiconductive body for a time period exceeding that required for establishing equilibrium of the alloying action, inverting the semiconductive body on the support structure to expose the opposite horizontal surface thereof, disposing a second three dimensional impurity body having an upper and lower surface and inner and outer walls and a plurality of electrically conductive bodies in spaced relation on the exposed surface of the semiconductive body, confining all of said bodies separately on their exposed sides, applying pressure to the upper surfaces of the second impurity body and to one of the electrically conductive bodies by the use of gravitational force of a predetermined weight on said upper surface to hold the body firmly against the semiconductive body but of insufficient value to force it into the surface thereof and heating the assembly of the bodies to said temperature for said time period.

2. The method of making a semiconductive signal translating device comprising the steps of disposing a germanium wafer upon a horizontal support surface, disposing an indium ring upon the exposed surface of the wafer, pressing the ring firmly against the wafer by the gravitational force of a predetermined weight having insufficient value to force the indium ring into the germanium wafer surface, confining the inner and outer peripheral edges of the ring, heating the wafer and ring to a temperature greater than the melting point of the ring and less than the melting point of the wafer for a time period exceeding that required for establishing equilibrium of the alloying action, inverting the wafer on the support surface, disposing a second indium ring upon the exposed surface of the germanium wafer, pressing the second indium ring against the germanium wafer by the gravitational force of a predetermined weight to hold it firmly against the germanium wafer but of insufficient value to force the second indium ring into the surface of the germanium wafer, confining the inner and outer peripheral edges of the second ring, applying at least one electrically conductive contact to the face of the germanium wafer at a point spaced from the second indium ring and heating the surface, both rings and contact to said temperature for said time period to fabricate a unitary device.

References Cited in the file of this patent

UNITED STATES PATENTS

| | | |
|---|---|---|
| 2,697,052 | Dacy et al. | Dec. 14, 1954 |
| 2,743,201 | Johnson et al. | Apr. 24, 1956 |
| 2,743,693 | Schaper | May 1, 1956 |
| 2,756,709 | Coonrod | July 31, 1956 |
| 2,791,524 | Ozarow | May 7, 1957 |
| 2,817,607 | Jenny | Dec. 24, 1957 |
| 2,835,615 | Leinfelder et al. | May 20, 1958 |

FOREIGN PATENTS

| | | |
|---|---|---|
| 1,122,216 | France | May 22, 1956 |